(12) United States Patent
Kai et al.

(10) Patent No.: US 11,720,026 B2
(45) Date of Patent: Aug. 8, 2023

(54) DEVELOPING TREATMENT METHOD, COMPUTER STORAGE MEDIUM AND DEVELOPING TREATMENT APPARATUS

(71) Applicant: Tokyo Electron Limited, Tokyo (JP)

(72) Inventors: Akiko Kai, Koshi (JP); Kousuke Yoshihara, Koshi (JP); Kouichirou Tanaka, Koshi (JP); Hiroshi Ichinomiya, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 641 days.

(21) Appl. No.: 16/466,864

(22) PCT Filed: Dec. 15, 2017

(86) PCT No.: PCT/JP2017/045135
§ 371 (c)(1),
(2) Date: Jun. 5, 2019

(87) PCT Pub. No.: WO2018/116985
PCT Pub. Date: Jun. 28, 2018

(65) Prior Publication Data
US 2020/0064742 A1    Feb. 27, 2020

(30) Foreign Application Priority Data

Dec. 19, 2016 (JP) ................. 2016-245063
Sep. 27, 2017 (JP) ................. 2017-187045
Dec. 5, 2017 (JP) ................. 2017-233389

(51) Int. Cl.
*G03F 7/32* (2006.01)
*H01L 21/67* (2006.01)
*H01L 21/687* (2006.01)
*G03F 7/00* (2006.01)

(52) U.S. Cl.
CPC ............ *G03F 7/32* (2013.01); *H01L 21/6715* (2013.01); *H01L 21/67051* (2013.01); *H01L 21/67098* (2013.01); *H01L 21/68764* (2013.01); *G03F 7/70925* (2013.01)

(58) Field of Classification Search
CPC ... G03F 7/32; G03F 7/322; G03F 7/30; G03F 7/168; G03F 7/11
See application file for complete search history.

(56) References Cited

U.S. PATENT DOCUMENTS

| | | | | |
|---|---|---|---|---|
| 5,342,738 A | * | 8/1994 | Ikeda | .................... G03F 7/3021 430/325 |
| 2007/0259287 A1 | * | 11/2007 | Sakakibara | ............... G03F 7/40 257/E21.027 |
| 2011/0123936 A1 | * | 5/2011 | Hori | ...................... G03F 7/0035 430/324 |

FOREIGN PATENT DOCUMENTS

| | | |
|---|---|---|
| JP | H05-029936 A | 2/1993 |
| JP | 2007-095888 A | 4/2007 |
| JP | 2009-094406 A | 4/2009 |
| JP | 2015-023172 A | 2/2015 |

OTHER PUBLICATIONS

International Search Report dated Mar. 13, 2018 issued in corresponding international patent application No. PCT/JP2017/045135 (and English translation thereof).

* cited by examiner

*Primary Examiner* — Daborah Chacko-Davis
(74) *Attorney, Agent, or Firm* — Posz Law Group, PLC

(57) ABSTRACT

A developing treatment method performs a developing treatment on a resist film on a substrate. The method includes: a pattern forming step of forming a resist pattern by supplying a developing solution to the substrate and developing the resist film on the substrate; a coating step of coating the developed substrate with an aqueous solution of a water-soluble polymer; and a rinse step of cleaning the substrate by supplying a rinse solution to the substrate coated with the aqueous solution of the water-soluble polymer.

18 Claims, 12 Drawing Sheets

FIG.7
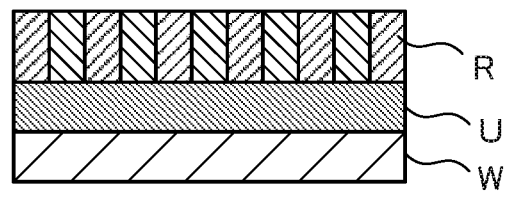
(A)
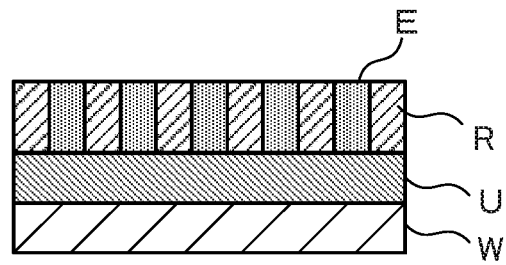
(B)
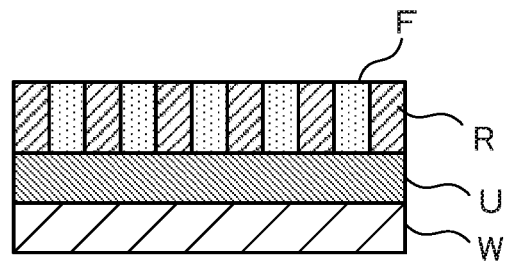
(C)
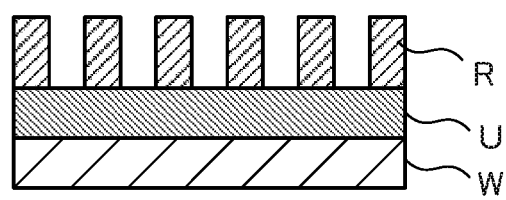
(D)

FIG.8
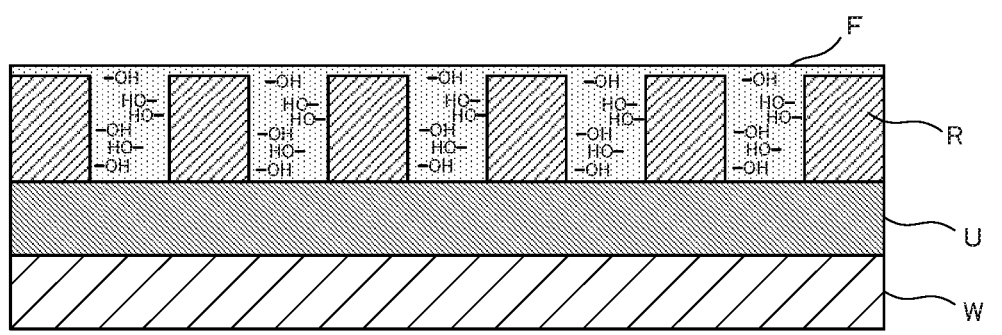
(A)
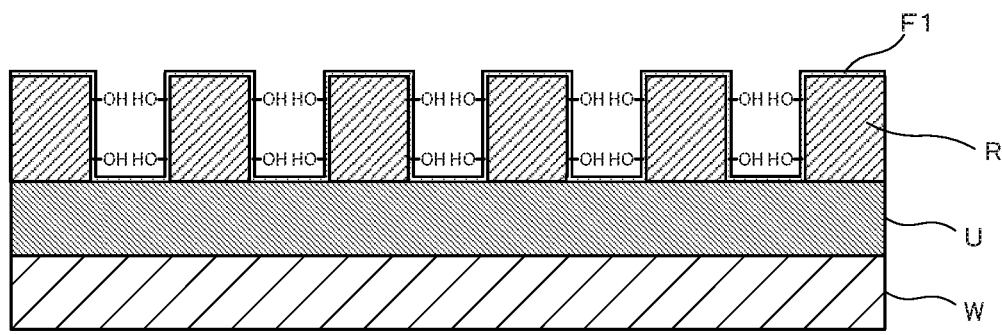
(B)

DEVELOPING TREATMENT METHOD, COMPUTER STORAGE MEDIUM AND DEVELOPING TREATMENT APPARATUS

CROSS-REFERENCE TO RELATED APPLICATIONS

Technical Field

This application is based upon and claims the benefit of priority of the prior Japanese Patent Application No. 2016-245063, filed in Japan on Dec. 19, 2016, the prior Japanese Patent Application No. 2017-187045, filed in Japan on Sep. 27, 2017, and the prior Japanese Patent Application No. 2017-233389, filed in Japan on Dec. 5, 2017, the entire contents of which are incorporated herein by reference.

The present invention relates to a developing treatment method, a computer storage medium, and a developing treatment apparatus for performing a developing treatment on a substrate formed with a resist film to form a predetermined pattern on the substrate.

Background Art

For example, in a photolithography step in a manufacturing process of a semiconductor device, a resist coating treatment of coating, for example, a top of a semiconductor wafer (hereinafter, referred to as a "wafer") as a substrate with a resist solution to form a resist film, exposure processing of exposing a predetermined pattern on the resist film, a heat treatment of accelerating a chemical reaction in the resist film after exposure (post-exposure baking), and a developing treatment of developing the exposed resist film with a developing solution, are sequentially performed to form a predetermined resist pattern on the wafer.

The above developing treatment is performed normally in a developing treatment apparatus, and a developing solution is supplied from a developing solution supply nozzle onto a wafer held, for example, by a spin chuck, and a solution film of the developing solution is formed on the surface of the wafer to develop the wafer in the developing treatment apparatus. Thereafter, a cleaning solution such as pure water is supplied from a cleaning solution supply nozzle onto the wafer, and the wafer is rotated at high speed and thereby cleaned. This cleaning removes a development product generated in the developing solution on the wafer during the development.

Incidentally, as the exposure technology and the like have been advancing, miniaturization of semiconductor devices further proceeds in recent years and a resist pattern that is fine and high in aspect ratio appears. In the fine resist pattern and the resist pattern high in aspect ratio, the cleaning solution remains on the wafer in the above-described development, more specifically, the cleaning solution remains between patterns, and the remaining cleaning solution brings about a problem of the occurrence of a so-called pattern collapse.

Patent Document 1 discloses that two or more kinds of cleaning solutions are used at a cleaning step in development of a resist pattern in order to prevent the occurrence of pattern collapse, the resist surface subjected to the treatment with the developing solution is exposed to the cleaning solution used at the first half step to thereby promote improvement of quality of the resist surface, and a contact angle between the cleaning solution used at the second half step and the resist surface is increased to 60 to 120°.

Note that a stress σ generated in the cleaning solution remaining between the patterns, namely, a force in a direction parallel to the substrate generated in the patterns by the cleaning solution remaining between the patterns is in the following relationship with a contact angle θ of the resist with respect to the cleaning solution and a surface tension γ of the cleaning solution.

$$\sigma \propto \gamma \cos \theta \qquad \text{(Expression 1)}$$

Prior Art Document

Patent Document

[Patent Document 1] Japanese Laid-open Patent Publication No. H5-29936

Disclosure of the Invention

Problems to be Solved by the Invention

Incidentally, a material high in water repellency is sometimes used as the material of resist.

However, the technique of Patent Document 1 is a technique relating to a resist having a contact angle with water as the cleaning solution of 0°, namely, a resist low in water repellency.

Besides, even if using a resist high in water repellency, in promotion of miniaturization, the pattern collapse occurs when the cleaning solution remains between the patterns during the development.

Further, if the cleaning solution remains between the patterns, namely, on the wafer, the development product contained in the cleaning solution will also remain on the wafer. The development product remaining on the wafer causes defects.

The present invention has been made in consideration of the above points, and its object is to suppress the occurrence of pattern collapse, obtain a finer pattern, and suppress the occurrence of defects in the case of using a resist high in water repellency.

Means for Solving the Problems

To achieve the above object, an aspect of the present invention is a developing treatment method for performing a developing treatment on a resist film on a substrate, the developing treatment method including: a pattern forming step of forming a resist pattern by supplying a developing solution to the substrate and developing the resist film on the substrate; a coating step of coating the developed substrate with an aqueous solution of a water-soluble polymer; and a rinse step of cleaning the substrate by supplying a rinse solution to the substrate coated with the aqueous solution of the water-soluble polymer.

A pH of the aqueous solution of the water-soluble polymer is preferably 3 to 6. Further, depending on the kind of the rinse solution, a pH of the rinse solution also becomes a factor for decision of a pH optimal value of the aqueous solution of the water-soluble polymer.

One aspect of the present invention according to another viewpoint is a computer-readable storage medium storing a program running on a computer of a control unit controlling a developing treatment apparatus to cause the developing treatment apparatus to execute the above-described developing treatment method.

One aspect of the present invention according to still another viewpoint is a developing treatment apparatus for performing a developing treatment on a resist film on a substrate, the developing treatment apparatus including: a substrate holding unit which holds the substrate; a developing solution supply nozzle which supplies a developing solution to the substrate; an aqueous solution supply nozzle which supplies an aqueous solution of a water-soluble polymer to the substrate; a rinse solution supply nozzle which supplies a rinse solution to the substrate; and a control unit configured to control the developing solution supply nozzle, the aqueous solution supply nozzle, and the rinse solution supply nozzle to execute: a pattern forming step of forming a resist pattern by supplying the developing solution to the substrate and developing the resist film on the substrate; a coating step of coating the developed substrate with the aqueous solution of the water-soluble polymer; and a rinse step of cleaning the substrate by supplying the rinse solution to the substrate coated with the aqueous solution of the water-soluble polymer.

Effect of the Invention

According to one aspect of the present invention, in the case of using a resist high in water repellency, no cleaning solution remains between patterns, namely, on a wafer, so that the occurrence of pattern collapse can be suppressed, a finer resist pattern can be obtained, and the occurrence of defects can also be prevented.

BRIEF DESCRIPTION OF THE DRAWINGS

FIG. 7 A sectional view illustrating an appearance of the wafer after a step relating to the developing treatment is performed.

FIG. 8 A view for explaining the reason why a contact angle of a resist is reduced by the developing treatment in this embodiment.

BEST MODE FOR CARRYING OUT THE INVENTION

Hereinafter, embodiments of the present invention will be explained. Note that in this description and the drawings, the same codes are given to components having substantially the same functional configurations to omit duplicated explanation.

Figure 1:
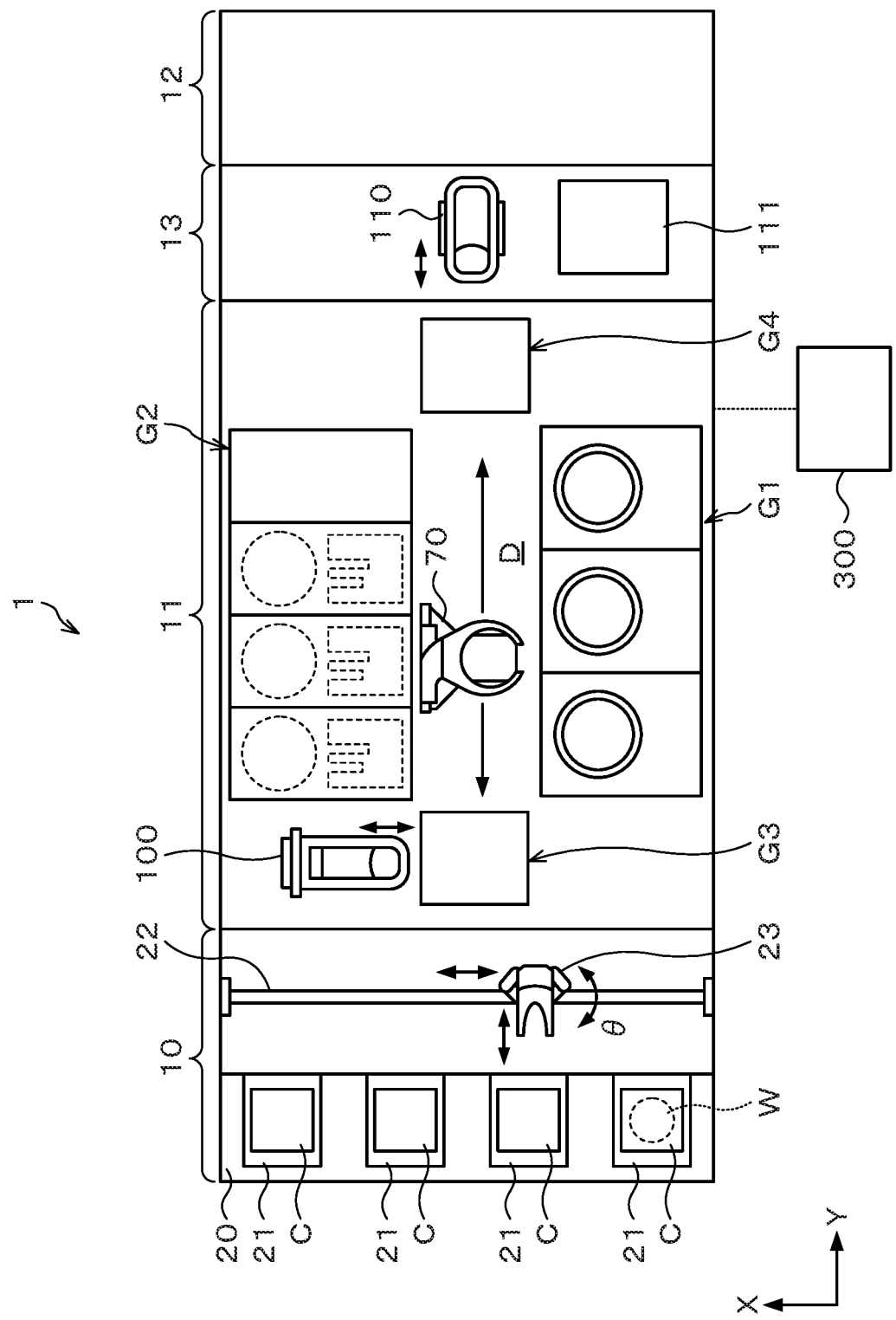
FIG. 1 A plan view illustrating an outline of a configuration of a substrate treatment system including a developing treatment apparatus according to an embodiment.
Figure 2:
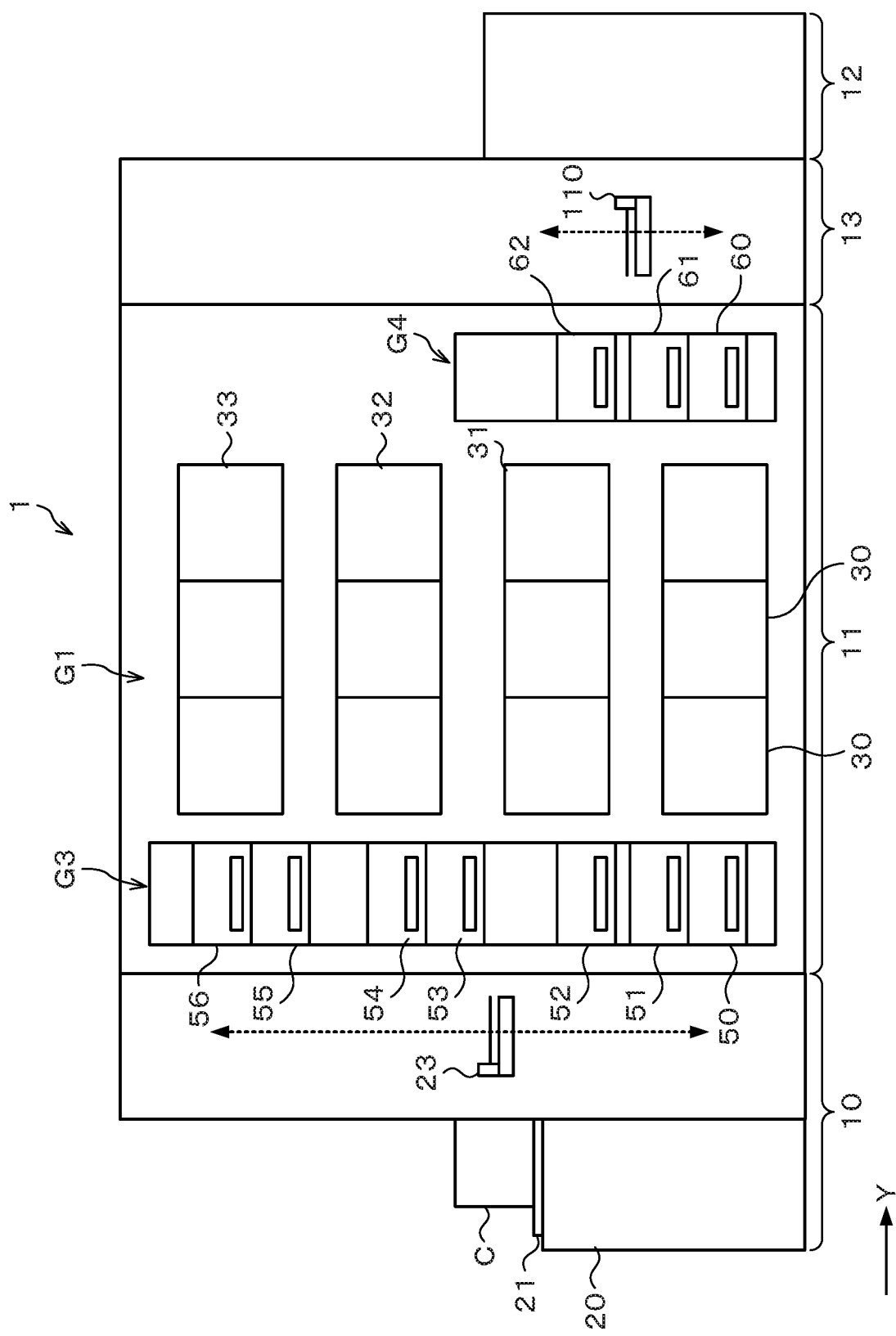
FIG. 2 A front view schematically illustrating the outline of the configuration of the substrate treatment system in FIG. 1.
Figure 3:
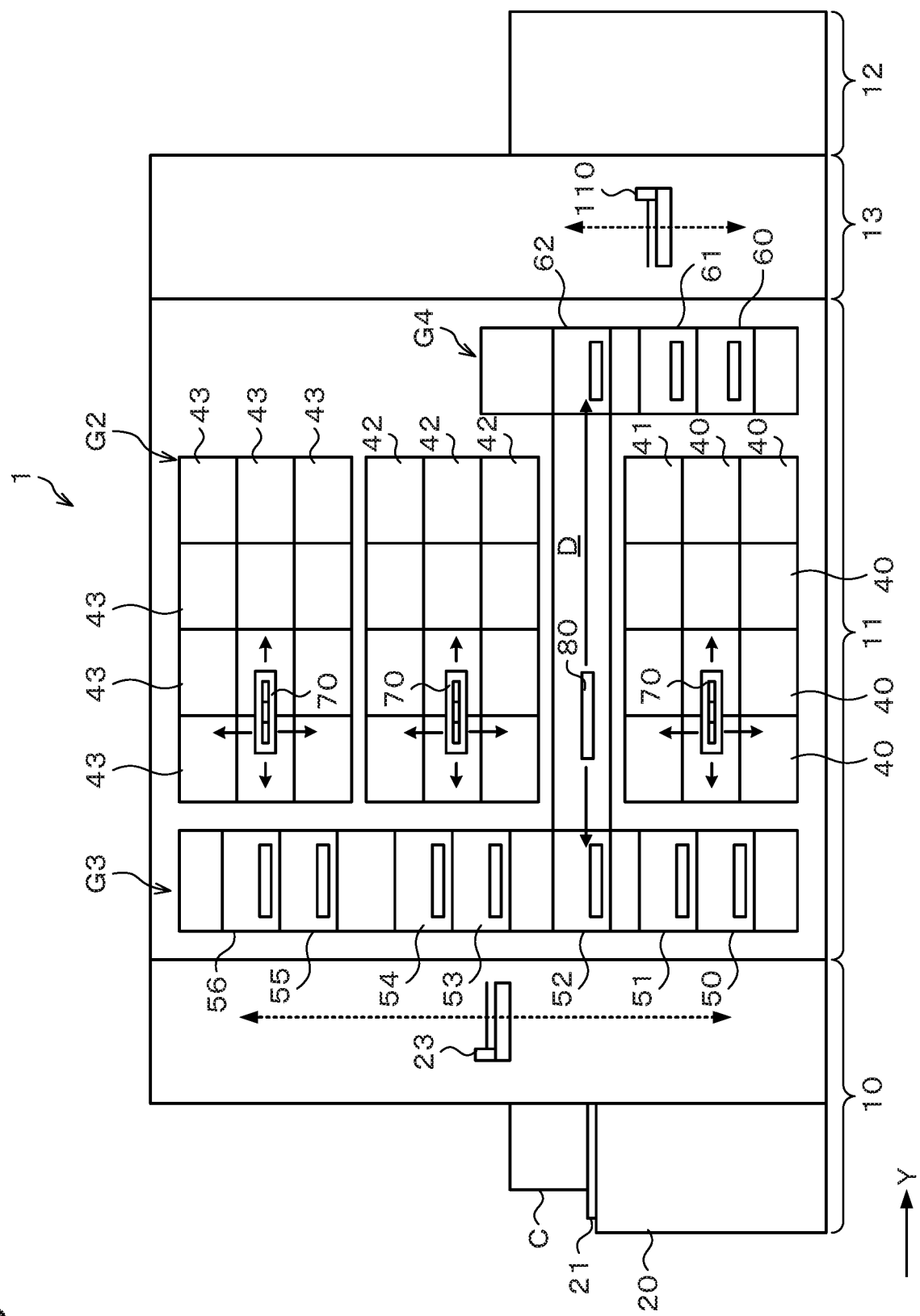
FIG. 3 A rear view schematically illustrating the outline of the configuration of the substrate treatment system in FIG. 1.

FIG. 1 is a planar explanatory view schematically illustrating the outline of a configuration of a substrate treatment system 1 including a developing treatment apparatus according to an embodiment of the present invention. FIG. 2 and FIG. 3 are a front view and a rear view schematically illustrating the outline of an internal configuration of the substrate treatment system 1, respectively.

The substrate treatment system 1 has, as illustrated in FIG. 1, a configuration in which a cassette station 10 into/out of which a cassette C housing a plurality of wafers W is transferred, a treatment station 11 including a plurality of various treatment apparatuses which perform predetermined treatments on the wafer W, and an interface station 13 which delivers the wafer W to/from an exposure apparatus 12 adjacent to the treatment station 11, are integrally connected.

In the cassette station 10, a cassette mounting table 20 is provided. The cassette mounting table 20 is provided with a plurality of cassette mounting plates 21 on which the cassettes C are mounted when the cassettes C are transferred in/out from/to the outside of the substrate treatment system 1.

In the cassette station 10, a wafer transfer apparatus 23 is provided which is movable on a transfer path 22 extending in an X-direction as illustrated in FIG. 1. The wafer transfer apparatus 23 is movable also in a vertical direction and around a vertical axis (in a θ-direction), and can transfer the wafer W between the cassette C on each of the cassette mounting plates 21 and a delivery apparatus in a later-described third block G3 in the treatment station 11.

In the treatment station 11, a plurality of, for example, four blocks, namely, a first block G1 to a fourth block G4 each including various apparatuses are provided. For example, the first block G1 is provided on the front side (X-direction negative direction side in FIG. 1) in the treatment station 11, and the second block G2 is provided on the rear side (X-direction positive direction side in FIG. 1, on the upper side in the drawing) in the treatment station 11. Further, the aforementioned third block G3 is provided on the cassette station 10 side (Y-direction negative direction side in FIG. 1) in the treatment station 11, and the fourth block G4 is provided on the interface station 13 side (Y-direction positive direction side in FIG. 1) in the treatment station 11.

For example, in the first block G1, as illustrated in FIG. 2, a plurality of solution treatment apparatuses, for example, developing treatment apparatuses 30 each of which performs a developing treatment on the wafer W, lower anti-reflection film forming apparatuses 31 each of which forms an anti-reflection film (hereinafter, referred to as a "lower anti-reflection film") at a lower layer of a resist film of the wafer W, resist coating apparatuses 32 each of which coats the wafer W with a resist solution to form a resist film, and upper anti-reflection film forming apparatuses 33 each of which forms an anti-reflection film (hereinafter, referred to as an "upper anti-reflection film") at an upper layer of the resist film of the wafer W, are arranged in order from the bottom.

For example, three pieces of each of the developing treatment apparatus 30, the lower anti-reflection film forming apparatus 31, the resist coating apparatus 32, and the upper anti-reflection film forming apparatus 33 are arranged side by side in the horizontal direction. Note that the numbers and the arrangement of the developing treatment apparatuses 30, the lower anti-reflection film forming apparatuses 31, the resist coating apparatuses 32, and the upper anti-reflection film forming apparatuses 33 can be arbitrarily selected.

In the lower anti-reflection film forming apparatus 31, the resist coating apparatus 32, and the upper anti-reflection film forming apparatus 33, for example, spin coating of coating the top of the wafer W with a predetermined coating solution is performed. In the spin coating, the coating solution is discharged, for example, from a coating nozzle onto the wafer W and the wafer W is rotated to diffuse the coating solution over the surface of the wafer W. Note that the configuration of the developing treatment apparatus 30 will be described later.

For example, in the second block G2, a plurality of thermal treatment apparatuses 40 to 43 are provided which perform thermal treatments such as heating and cooling on the wafer W as illustrated in FIG. 3.

For example, in the third block G3, a plurality of delivery apparatuses 50, 51, 52, 53, 54, 55, 56 are provided in order from the bottom as illustrated in FIG. 2 and FIG. 3. Further, in the fourth block G4, a plurality of delivery apparatuses 60, 61, 62 are provided in order from the bottom as illustrated in FIG. 3.

A wafer transfer region D is formed in a region surrounded by the first block G1 to the fourth block G4 as illustrated in FIG. 1. In the wafer transfer region D, for example, a plurality of wafer transfer apparatuses 70 are arranged each of which has a transfer arm movable, for example, in the Y-direction, the X-direction, the θ-direction, and the vertical direction. The wafer transfer apparatus 70 can move in the wafer transfer region D to transfer the wafer W with respect to a predetermined apparatus in the first block G1, the second block G2, the third block G3, and the fourth block G4 located therearound.

Further, in the wafer transfer region D, a shuttle transfer apparatus 80 is provided which linearly transfers the wafer W between the third block G3 and the fourth block G4 as illustrated in FIG. 3.

The shuttle transfer apparatus 80 is configured to be linearly movable, for example, in the Y-direction in FIG. 3. The shuttle transfer apparatus 80 can move in the Y-direction while supporting the wafer W, and transfer the wafer W between the delivery apparatus 52 in the third block G3 and the delivery apparatus 62 in the fourth block G4.

As illustrated in FIG. 1, a wafer transfer apparatus 100 is provided adjacent on the X-direction positive direction side of the third block G3. The wafer transfer apparatus 100 has a transfer arm movable, for example, in the X-direction, the θ-direction, and the vertical direction. The wafer transfer apparatus 100 can move up and down while supporting the wafer W to transfer the wafer W to each of the delivery apparatuses in the third block G3.

In the interface station 13, a wafer transfer apparatus 110 and a delivery apparatus 111 are provided. The wafer transfer apparatus 110 has a transfer arm movable, for example, in the Y-direction, the θ-direction, and the vertical direction. The wafer transfer apparatus 110 can transfer the wafer W between each of the delivery apparatuses in the fourth block G4, the delivery apparatus 111 and the exposure apparatus 12, for example, while supporting the wafer W by the transfer arm.

In the above substrate treatment system 1, a control unit 300 is provided as illustrated in FIG. 1. The control unit 300 is, for example, a computer and has a program storage unit (not illustrated). In the program storage unit, a program for controlling the treatments on the wafer W in the substrate treatment system 1 is stored. Further, the program storage unit also stores programs for controlling the operations of the above-described various treatment apparatuses and a driving system such as the transfer apparatuses and later-described nozzle drive units 166, 169, 172, 175 and the like to realize a later-described developing treatment in the substrate treatment system 1. Note that the above programs may be the ones which are recorded, for example, on a computer-readable storage medium such as a computer-readable hard disk (HD), flexible disk (FD), compact disk (CD), magneto-optical disk (MO), or memory card, and installed from the storage medium into the control unit 300.

Next, the outline of a wafer treatment performed using the substrate treatment system 1 configured as described above will be explained. First, the cassette C housing a plurality of wafers W is transferred into the cassette station 10 of the substrate treatment system 1 and each of the wafers W in the cassette C is successively transferred by the wafer transfer apparatus 23 to the delivery apparatus 53 in the treatment station 11.

Then, the wafer W is transferred by the wafer transfer apparatus 70 to the thermal treatment apparatus 40 in the second block G2 and subjected to a temperature regulation treatment. The wafer W is thereafter transferred by the wafer transfer apparatus 70, for example, to the lower anti-reflection film forming apparatus 31 in the first block G1, in which a lower anti-reflection film is formed on the wafer W. The wafer W is then transferred to the thermal treatment apparatus 41 in the second block G2 and subjected to a heat treatment.

The wafer W is thereafter transferred by the wafer transfer apparatus 70 to the thermal treatment apparatus 42 in the second block G2 and subjected to a temperature regulation treatment. Thereafter, the wafer W is transferred by the wafer transfer apparatus 70 to the resist coating apparatus 32 in the first block G1, in which a resist film is formed on the wafer W. The wafer W is then transferred to the thermal treatment apparatus 43 and subjected to a pre-baking treatment.

Then, the wafer W is transferred to the upper anti-reflection film forming apparatus 33 in the first block G1, in which an upper anti-reflection film is formed on the wafer W. The wafer W is then transferred to the thermal treatment apparatus 43 in the second block G2 and subjected to a heat treatment. Thereafter, the wafer W is transferred by the wafer transfer apparatus 70 to the delivery apparatus 56 in the third block G3.

Then, the wafer W is transferred by the wafer transfer apparatus 100 to the delivery apparatus 52 and transferred by the shuttle transfer apparatus 80 to the delivery apparatus 62 in the fourth block G4. Thereafter, the wafer W is transferred by the wafer transfer apparatus 110 in the interface station 13 to the exposure apparatus 12 and subjected to exposure processing in a predetermined pattern.

Then, the wafer W is transferred by the wafer transfer apparatus 70 to the thermal treatment apparatus 40 and subjected to a post-exposure baking treatment. This causes a deprotection reaction with an acid generated at an exposed portion of the resist film. Thereafter, the wafer W is transferred by the wafer transfer apparatus 70 to the developing treatment apparatus 30 and subjected to a developing treatment.

First Embodiment

Figure 4:
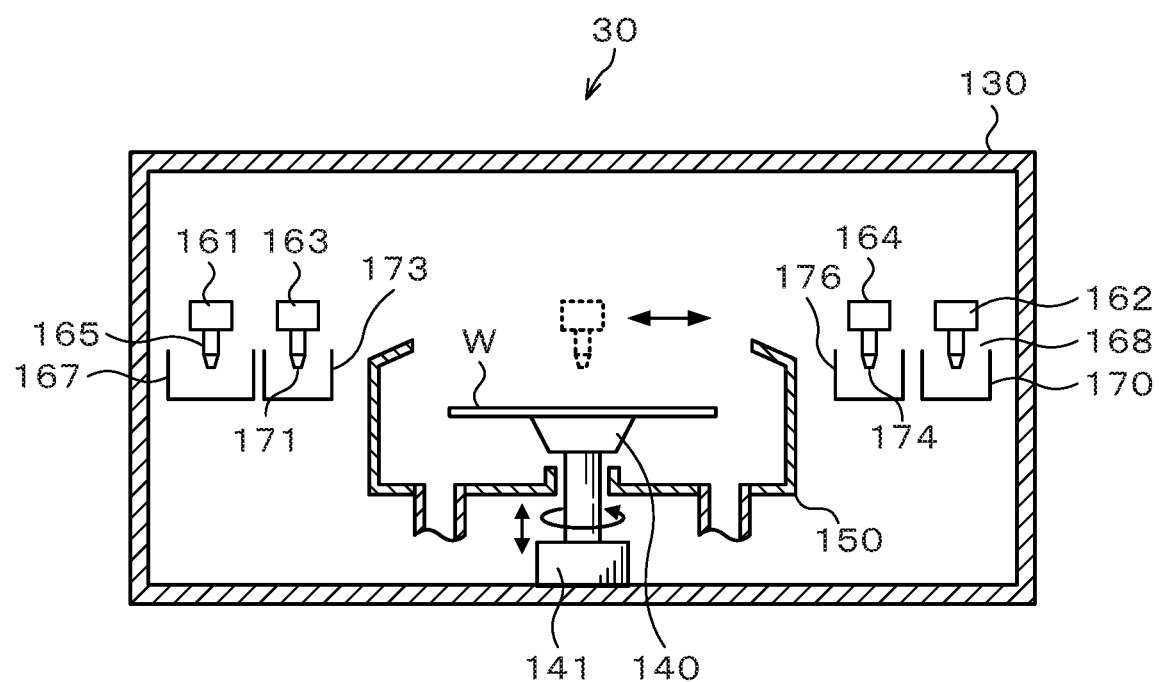
FIG. 4 A longitudinal sectional view schematically illustrating the outline of a configuration of a developing treatment apparatus according to a first embodiment of the present invention.

Next, the configuration of a developing treatment apparatus 30 according to a first embodiment of the present invention will be explained using FIG. 4 and FIG. 5. The developing treatment apparatus 30 has a treatment container 130 whose inside is sealable as illustrated in FIG. 4. A side surface of the treatment container 130 is formed with a transfer-in/out port (not illustrated) for the wafer W.

In the treatment container 130, a spin chuck 140 is provided which holds the wafer W and rotates it around the vertical axis. The spin chuck 140 can rotate at a predetermined speed by a chuck drive unit 141 such as a motor. Further, the chuck drive unit 141 is provided with a not-illustrated raising and lowering drive mechanism such as a cylinder, so that the spin chuck 140 can operate to raise and lower the wafer by the raising and lowering drive mechanism.

A cup 150 is provided to surround the wafer W held by the spin chuck 140. The cup 150 is intended to receive and collect liquid splashing or dropping from the wafer W.

Figure 5:
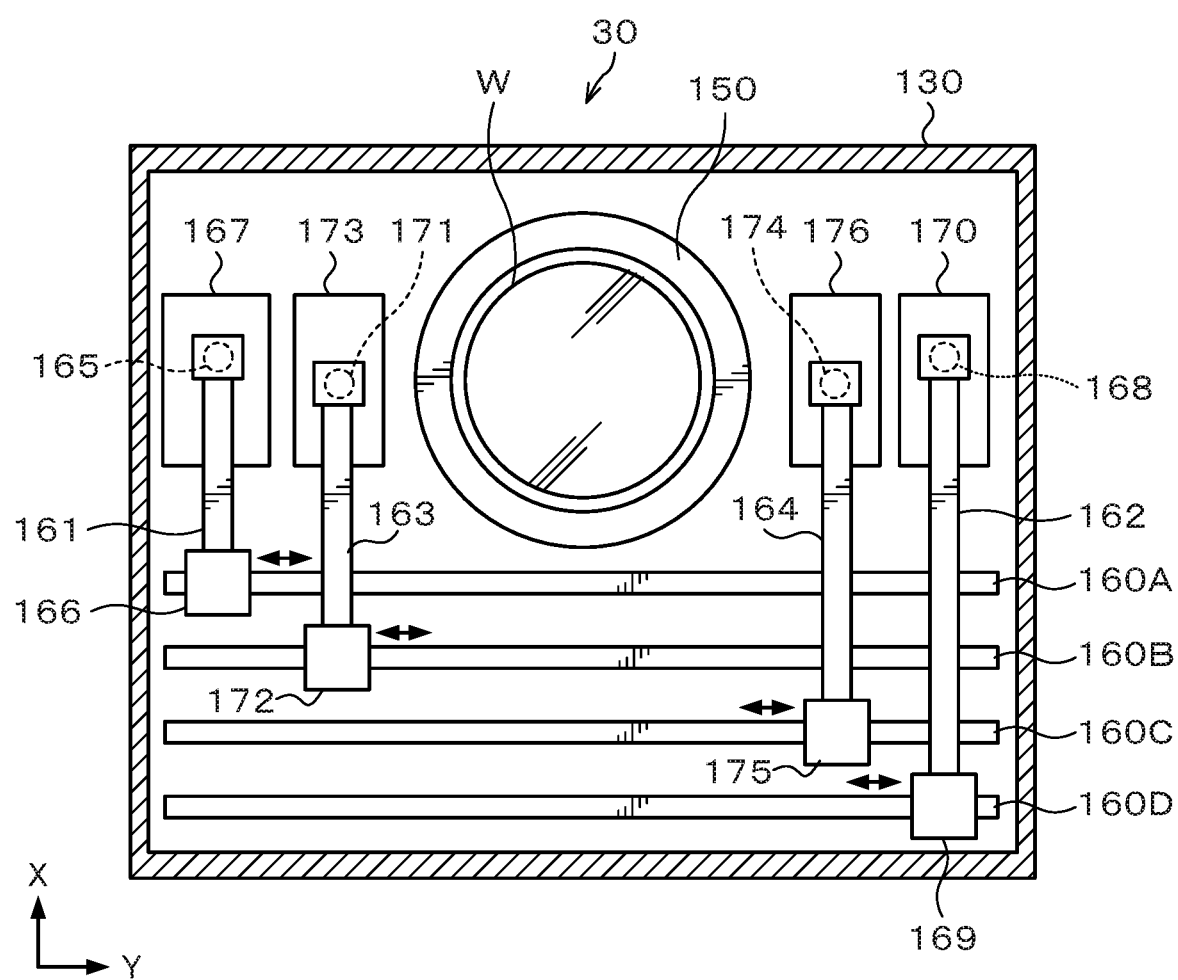
FIG. 5 A transverse sectional view schematically illustrating the outline of the configuration of the developing treatment apparatus according to the first embodiment of the present invention.

As illustrated in FIG. 5, on an X-direction negative direction (lower direction in FIG. 5) side of the cup 150, rails 160A to 160D extending along a Y-direction (right-left direction in FIG. 5) are formed. The rails 160A to 160D are formed, for example, from a Y-direction negative direction (left direction in FIG. 5) side outer position of the cup 150 to a Y-direction positive direction (right direction in FIG. 5) side outer position. To the rails 160A, 160B, 160C, 160D, for example, corresponding arms 161, 163, 164, 162 are attached respectively.

On the first arm 161, a developing solution supply nozzle 165 is supported which supplies a developing solution. The first arm 161 is movable on the rail 160A by a nozzle drive unit 166. Thus, the developing solution supply nozzle 165 can move from a waiting section 167 provided at a Y-direction negative direction side outer position of the cup 150 to above a central portion of the wafer W in the cup 150. Further, the first arm 161 can freely rise and lower by the nozzle drive unit 166 and thereby adjust the height of the developing solution supply nozzle 165. As the developing solution, for example, tetramethylammonium hydroxide (TMAH) is used.

On the second arm 162, a water-based cleaning solution supply nozzle 168 is supported which supplies DIW (Deionized Water) being one example of "water-based cleaning solution".

The second arm 162 is movable on the rail 160D by a nozzle drive unit 169. Thus, the water-based cleaning solution supply nozzle 168 can move from a waiting section 170 provided at a Y-direction positive direction side outer position of the cup 150 to above a central portion of the wafer W in the cup 150. Further, the second arm 162 can freely rise and lower by the nozzle drive unit 169 and thereby adjust the height of the water-based cleaning solution supply nozzle 168.

On the third arm 163, an aqueous solution supply nozzle 171 is supported which supplies an aqueous solution of a water-soluble polymer. The aqueous solution of the water-soluble polymer is intended to reduce a contact angle of a resist pattern formed by developing the resist film with the developing solution, with respect to water. The third arm 163 is movable on the rail 160B by a nozzle drive unit 172. Thus, the aqueous solution supply nozzle 171 can move from a waiting section 173 provided on a Y-direction positive direction side of the cup 150 and at a position between the waiting section 167 and the cup 150, to above a central portion of the wafer W in the cup 150. Further, the third arm 163 can freely rise and lower by the nozzle drive unit 172 and thereby adjust the height of the aqueous solution supply nozzle 171.

The water-soluble polymer contained in the aqueous solution of the water-soluble polymer is, for example, a homopolymer or a copolymer of a monomer containing a hydrophilic group, a polycondensate having a hydrophilic group, or the like. Concrete examples of the water-soluble polymer include acrylic acid, methacrylic acid, fluoroacrylic acid, perfluoroalkyl acid, vinyl alcohol, vinyl pyrrolidone, acrylic ester, methacrylate ester, polyvinyl alcohol (including partially saponified product), polyacrylic acid, polymethacrylic acid, polyvinylmethylether, polyvinylpyrrolidone, polyethylene glycol, polyvinyl acetal, (including partially acetalized product), polyethyleneimine, polyethyleneoxide, styrene-maleic anhydride copolymer, polyvinylamine, polyallylamine, oxazoline group-containing water-soluble resin, water-soluble melamine resin, water-soluble urea resin, alkyd resin, and sulfonamide and salts produced by them. Besides, as the water-soluble polymer, polyglycerin may be used. These water-soluble polymers may be used singly or two or more kinds may be used in combination. The concentration of the water-soluble polymer in the aqueous solution is preferably less than 10% and more preferably less than 5%.

A surfactant may be added to the above aqueous solution. Concrete examples of the surfactant include sorbitan monooleate, glycerol α-monooleate, polyethylene glycol sorbitan fatty ester, polyethylene glycol straight-chain alkyl ether, polyethylene glycol phenyl ether straight-chain alkyl-addition, branched-chain alkyl-addition, acetylene glycol, anionic sodium laurate, sodium stearate, sodium oleate, sodium dodecyl sulfate, sodium dodecylbenzenesulfonic acid, and the like. These surfactants may be used singly or two or more kinds may be used in combination. The concentration of the surfactant in the aqueous solution is preferably less than 5%.

Further, the above aqueous solution is preferably acidic and, more specifically, the pH of the above aqueous solution is preferably 3 to 6.

On the fourth arm 164, a rinse solution supply nozzle 174 is supported which supplies a rinse solution. The fourth arm 164 is movable on the rail 160C by a nozzle drive unit 175. Thus, the rinse solution supply nozzle 174 can move from a waiting section 176 provided on a Y-direction positive direction side of the cup 150 and at a position between the waiting section 170 and the cup 150, to above a central portion of the wafer W in the cup 150. Further, the fourth arm 164 can freely rise and lower by the nozzle drive unit 175 and thereby adjust the height of the rinse solution supply nozzle 174. As the rinse solution, for example, a surfactant-containing rinse solution made by mixing a surfactant solution and pure water.

Note that the numbers of the arms and the rails are reduced in some cases by attaching a plurality of nozzles which do not need to be separated in terms of process operation among the developing solution supply nozzle 165, the water-based cleaning solution supply nozzle 168, the aqueous solution supply nozzle 171, and the rinse solution supply nozzle 174, to one arm.

Figure 6:
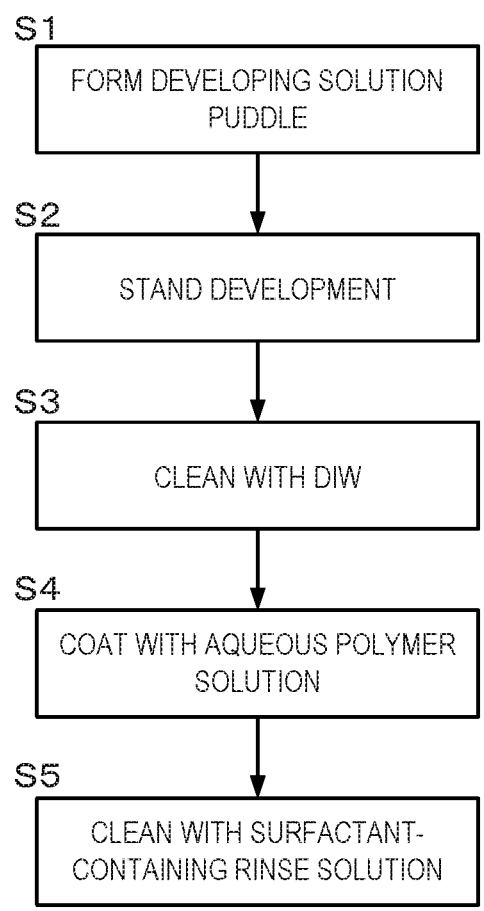
FIG. 6 A flowchart illustrating an example of the developing treatment according to the first embodiment of the present invention.

Here, an example of the developing treatment in the developing treatment apparatus 30 will be explained using FIG. 6 and FIG. 7. FIG. 6 is a flowchart illustrating an example of the developing treatment. FIG. 7 is a sectional view illustrating the appearance of the wafer W after the step relating to the developing treatment is performed. Note that in the following explanation, a lower-layer film such as SiARC (Silicon-containing Anti-Reflective Coating) or the like is formed on the surface of the wafer W, and the resist film is formed on the lower-layer film, and the resist film has been already exposed.

In the developing treatment on the wafer W held by the spin chuck 140, first, as illustrated in FIG. 6, the developing solution supply nozzle 165 is moved to above the central portion of the wafer W, and the wafer W makes, for example, one rotation while the developing solution supply nozzle 165 is supplying the developing solution in a band shape, to thereby form a developing solution puddle on the entire surface of the wafer W (Step S1).

After the formation of the developing solution puddle, the supply of the developing solution is stopped and, for example, stand development of making the wafer W stand still for a predetermined time is performed to cause the development of the resist film on the wafer W to proceed (Step S2). In this event, the developing solution supply nozzle 165 is retracted to the outside of the cup 150, and the water-based cleaning solution supply nozzle 168 is moved instead to the central portion of the wafer W.

After the predetermined time for making the development to proceed has elapsed and resist patterns R are formed on a lower-layer film U of the wafer W as illustrated in FIG. 7(A), DIW is supplied from the water-based cleaning solution supply nozzle 168 to the wafer W to clean the wafer W (Step S3). The rotation speed of the wafer W at this time is 100 to 1500 rpm. This removes the developing solution and a dissolution product and thereby creates a state where a film E of DIW is formed at least between the resist patterns R as illustrated in FIG. 7(B).

Then, the water-based cleaning solution supply nozzle 168 is retracted to the outside of the cup 150, and the aqueous solution supply nozzle 171 is moved to the central portion of the wafer W.

After the removal of the developing solution and the like, the aqueous solution supply nozzle 171 supplies the aqueous solution of the water-soluble polymer to the wafer W to coat the wafer W with the aqueous solution, thereby forming a solution film F of the aqueous solution of the water-soluble polymer at least between the resist patterns R as illustrated in FIG. 7(C) (Step S4). The rotation speed of the wafer W at this time is, for example, 100 to 1500 rpm.

Then, the aqueous solution supply nozzle 171 is retracted to the outside of the cup 150, and the rinse solution supply nozzle 174 is moved to the central portion of the wafer W.

After the coating with the aqueous solution of the water-soluble polymer, the wafer W is cleaned with the surfactant-containing rinse solution (Step S5). More specifically, the surfactant-containing rinse solution is supplied to the wafer W while the wafer W is being rotated, for example, at 100 to 500 rpm, and the aqueous solution of the water-soluble polymer on the wafer W is replaced with the rinse solution, and then the number of rotations of the wafer W is increased to spread the rinse solution and spin off the rinse solution to thereby dry the wafer W. In this event, the wafer W is first rotated at 300 to 1000 rpm for 5 to 15 seconds, and then rotated at 1000 to 3000 rpm for 10 to 20 seconds.

This forms the resist patterns R on the wafer W as illustrated in FIG. 7(D).

Note that the cleaning step with DIW may be omitted.

In comparison with the case where only the cleaning step with DIW after the developing step without performing a coating step of the aqueous solution of the water-soluble polymer and a cleaning (rinse) step with the surfactant-containing rinse solution in the developing treatment unlike this embodiment, performing the developing treatment in this embodiment makes it possible to obtain a precise resist pattern pattern. More specifically, in the case of performing the developing treatment including only the cleaning step with DIW, a collapse limit of the pattern is about 37 nm, whereas in the case of performing the developing treatment in this embodiment, the collapse limit of the pattern is improved up to about 33 nm. Note that the collapse limit of the pattern means the width of a resist pattern having the smallest width among resist patterns in which the pattern collapse is not observed when observing the wafer under a SEM (Scanning Electron Microscope) after the wafer is subjected to scan exposure while the dose amount is being changed within the same wafer so as to form line-and-space resist patterns and then subjected to the developing treatment. Note that the above result is the inspection result using the wafer having line-and-space resist patterns having a pitch of 90 nm.

Besides, the height of the pattern is not reduced even if the developing treatment in this embodiment is performed. More specifically, the collapse limit is improved not by the reduction in height of the pattern, and the precise resist pattern can be obtained without reducing the height of the pattern by the developing treatment in this embodiment.

Conceivable reasons for the improvement in collapse limit of the pattern are as follows. Specifically, in the case of performing the developing treatment including only the cleaning step with DIW after the developing step, the respective contact angles of the wafer W and the resist after the developing treatment with respect to water are about 75°, 70°, whereas in the case of performing the developing treatment in this embodiment, those contact angles reduce down to 63°, 65°. When the respective contact angles of the lower-layer film and the resist after the developing treatment with respect to water are large, solution break of the rinse solution is likely to occur at spin-off drying, but reduction in the contact angles causes less solution break. Specifically, it is considered that since the rinse solution causing the pattern collapse does not remain on the wafer W, the collapse limit of the pattern is improved.

FIG. 8 is a view explaining the reason why the contact angles reduce by the developing treatment in this embodiment. Note that the hydrophilic group contained in the water-soluble resin is a hydroxy group (OH group) in this example.

As illustrated in FIG. 8(A), the solution film F made of the aqueous solution of the water-soluble polymer having the OH groups is formed after development, whereby the surface of the resist pattern R and the water-soluble polymer having the OH groups in the solution film F undergo a cross-linking reaction. Therefore, for example, even in a state where the solution film F is removed, the resist pattern R is coated with a water-soluble polymer F1 having the OH groups as illustrated in FIG. 8(B). Thus, the contact angle of the resist pattern R with respect to water is considered to reduce. Besides, though the illustration of the OH groups is omitted, the lower-layer film U is also coated with the water-soluble polymer F1 having the OH groups. Accordingly, the contact angle of the lower-layer film U with respect to water is also considered to reduce.

Hereinafter, the effects of the developing treatment in this embodiment will be further explained.

According to the developing treatment in this embodiment, the solution break hardly occurs as described above, and the rinse solution does not remain on the wafer W, so that the development product contained in the rinse solution does not remain of the wafer either.

Further, according to the developing treatment in this embodiment, the wafer W is cleaned with DIW at Step S3 and thereafter coated with the aqueous solution of the water-soluble polymer, so that in the case where DIW does not remain but the development product remains on the wafer W after the wafer cleaning at Step S3, the development product can be efficiently removed.

Therefore, according to the developing treatment in this embodiment, the occurrence of defects caused by the development product can be prevented.

Note that there are two conceivable reasons why the development product remaining on the wafer W can be efficiently removed by coating with the aqueous solution of the water-soluble polymer are (1), (2) in the following.

(1) In the case where the development product remaining on the wafer W is hydrophilic, by coating with the above aqueous solution, the development product is covered with the water-soluble polymer and made hydrophobic, so that the development product becomes more likely to disperse in the rinse solution at the rinse step for the wafer W and can remove the development product at the rinse step for the wafer W.

(2) In the case where the development product remaining on the wafer W is hydrophobic, by coating with the above aqueous solution, the development product is made hydrophilic with an additive agent, so that the lift-off effect of peeling the development product from the wafer W increases and can remove the development product at the rinse step for the wafer W.

In the developing treatment in this embodiment, the aqueous solution of the water-soluble polymer is used as described above. Accordingly, the above aqueous solution of the water-soluble polymer is superior to the water-based cleaning solution containing the surface-active agent-containing rinse solution in the covering property for the wafer on which a resist film having a large contact angle with respect to water is formed, namely, a water repellent substrate. Accordingly, use of this aqueous solution can treat the wafer uniformly within a plane.

Further, in the developing treatment in this embodiment, setting the pH of the aqueous solution of the water-soluble polymer to 3 to 6 as with the pH of the surface-active agent-containing rinse solution can prevent the above aqueous solution from damaging the resist pattern.

Further, in the developing treatment in this embodiment, the wafer W is cleaned with the surfactant-containing rinse solution. The surfactant-containing rinse solution is low in surface tension and therefore causes less stress in the remaining rinse solution even if it remains between the patterns (refer to the above-described Expression (1)). Accordingly, use of the surfactant-containing rinse solution can suppress the pattern collapse as described above.

Note that though the surfactant-containing rinse solution is used as the rinse solution in the above explanation, DIW may be used as the rinse solution. Also in this case, the collapse limit is about 35 nm, which is an improvement of about 2 nm.

Besides, in the case of using DIW as the rinse solution, not merely the center of the wafer W is coated with the rinse solution and spin-off dried, but the following may be performed. Specifically, the rinse solution is discharged to the center of the wafer W and spread over the entire wafer by the centrifugal force, then jetting of gas to the central portion of the wafer W is started while the rotation of the wafer W is maintained to form a dry region (dry core) at the central portion, and the discharge position of the rinse solution is changed to an eccentric position, namely, to the outside of the above dry region. Then, the discharge position of the rinse solution is moved toward the peripheral edge of the wafer W and the jetting position of the gas may also be moved toward the peripheral edge of the wafer W to spread the dry region. Thus, the cleaning with the rinse solution and the dry of the rinse solution may be performed.

As described above, in the developing treatment in this embodiment, the precise pattern can be obtained irrespective of the kind of the rinse solution and the cleaning method using the rinse solution. Accordingly, even if any kind of rinse solution and any cleaning method are selected for improvement of the defect performance, the precise pattern can be obtained in the developing treatment in this embodiment. In other words, the defect performance can also be improved in the developing treatment in this embodiment.

Note that though DIW is exemplified as the water-based cleaning solution in this embodiment, pure water may be used, or a cleaning solution in which a small amount of other substance is added to pure water may be used, as long as the cleaning solution contains water as a main component (for example, the content of water is 50 mass % or more).

Second Embodiment

Next, the configuration of a developing treatment apparatus 30 according to a second embodiment of the resent invention will be explained using FIG. 9 and FIG. 10.

Figure 9:
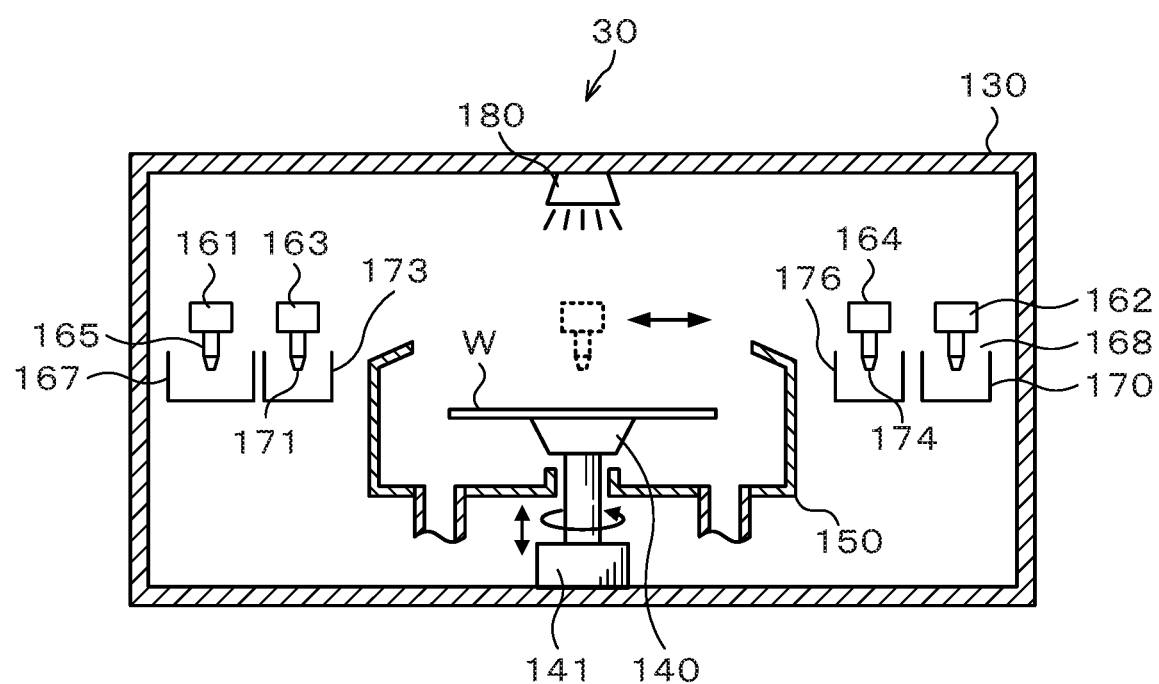
FIG. 9 A longitudinal sectional view schematically illustrating the outline of a configuration of a developing treatment apparatus according to a second embodiment of the present invention.

As illustrated in FIG. 9, the developing treatment apparatus 30 according to the second embodiment includes a lamp heating apparatus 180 as a heating apparatus on the inside of a top plate portion of the developing treatment apparatus 30.

Figure 10:
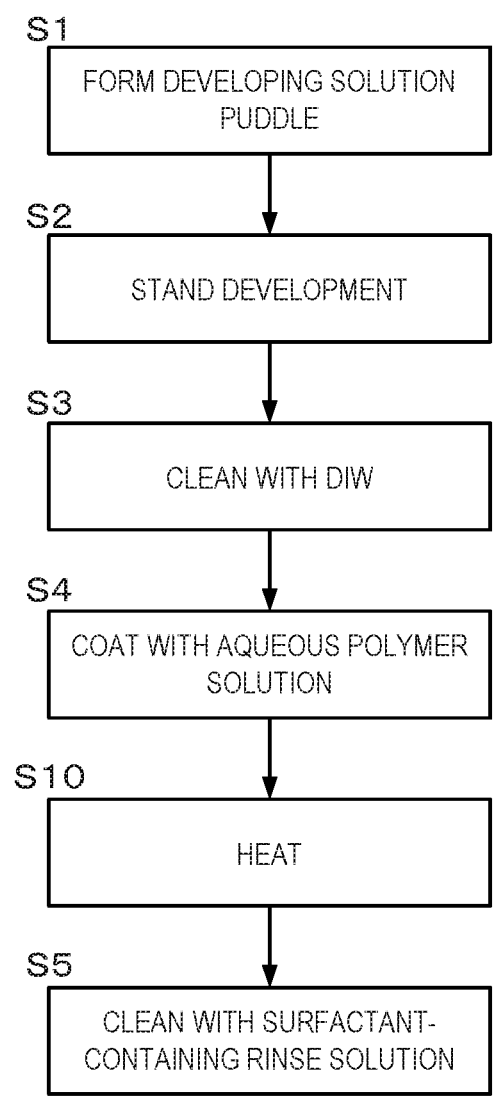
FIG. 10 A flowchart illustrating an example of the developing treatment according to the second embodiment of the present invention.

In an example of the developing treatment in the developing treatment apparatus 30 in this embodiment, the wafer W is heated by the lamp heating apparatus 180 after the coating with the aqueous solution of the water-soluble polymer and before the cleaning with the rinse solution as illustrated in FIG. 10 (Step S10).

This promotes the crosslinking of the surface of the resist pattern and the contact angle of the resist pattern with respect to water is considered to further reduce. Accordingly, the developing treatment in this embodiment is effective in the case of giving priority to the suppression of the pattern collapse of the suppression of the pattern collapse and the suppression of the occurrence of defects, namely, in the case where a further precise resist pattern is required.

Figure 11:
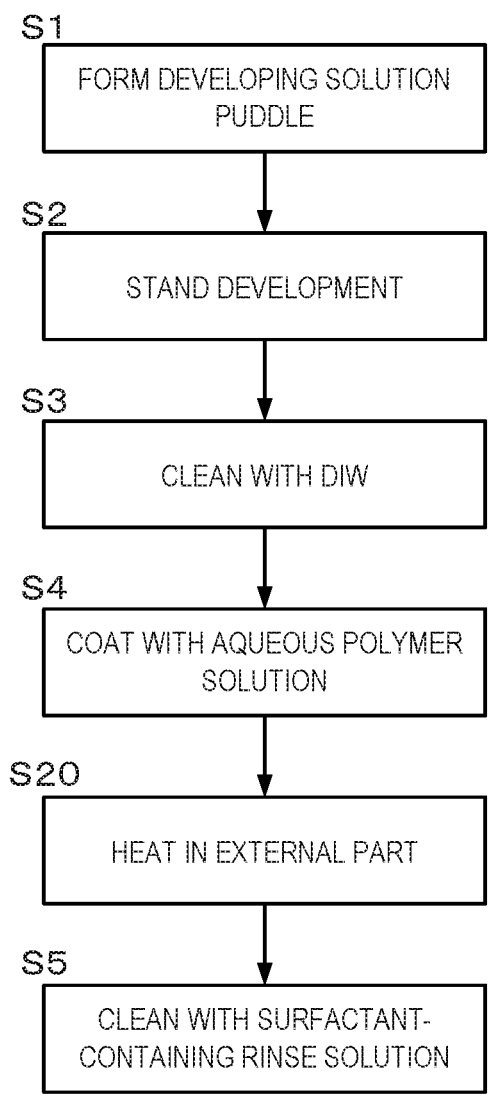
FIG. 11 A flowchart illustrating another example of the developing treatment according to the second embodiment of the present invention.

FIG. 11 is a flowchart illustrating another example of the developing treatment according to the second embodiment of the present invention.

The developing treatment apparatus 30 does not have the heating apparatus such as the lamp heating apparatus 180 in some cases unlike FIG. 9.

In this case, as illustrated in FIG. 11, coating with the aqueous solution of the water-soluble polymer is performed (Step S4), then the wafer W is moved from the developing treatment apparatus 30 to any of the thermal treatment apparatuses 40 to 43 (refer to FIG. 2). Then, the heat treatment is performed in the thermal treatment apparatus 40 to 43 (Step S20), and thereafter the wafer W may be returned to the developing treatment apparatus 30 and cleaned with the surfactant-containing rinse solution (Step S5).

Note that both in the case where the developing treatment apparatus 30 includes the heating apparatus and in the case where the developing treatment apparatus 30 does not include the heating apparatus, the cleaning step with DIW may be omitted.

Third Embodiment

Next, a developing treatment according to a third embodiment will be explained using FIG. 12. The configuration of a developing treatment apparatus 30 in this embodiment is the same as that in the first embodiment. Note that the cleaning step with DIW may be omitted also in this embodiment.

Figure 12:
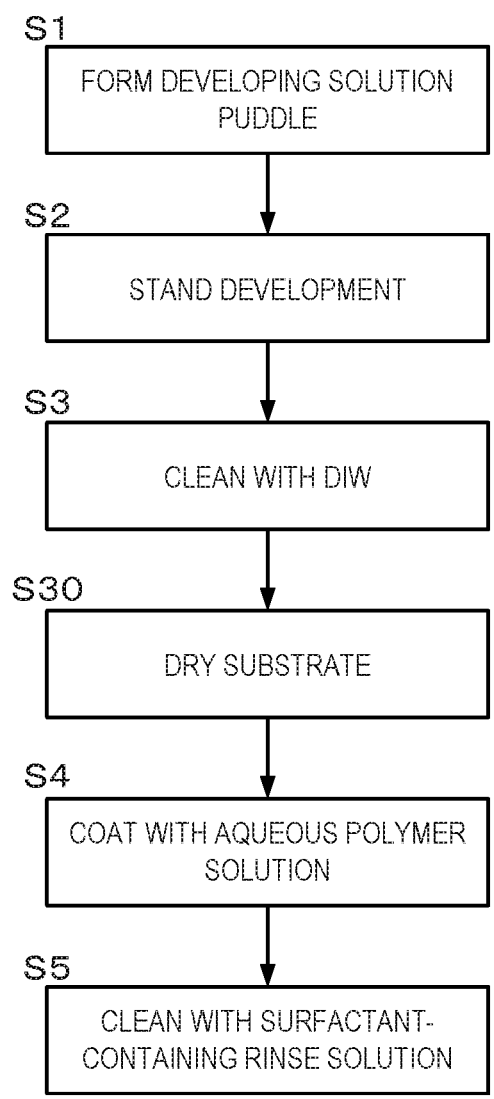
FIG. 12 A flowchart illustrating an example of the developing treatment according to a third embodiment of the present invention.

In the developing treatment according to this embodiment, as illustrated in FIG. 12, the supply of the water-based cleaning solution is stopped and a drying step of rotating the wafer W, for example, at 1000 to 4000 rpm is performed after the cleaning with the water-based cleaning solution and before the coating with the aqueous solution of the water-soluble polymer (Step S30). The time period for which the drying step is performed is preferably 10 seconds or less. This is because if the time period exceeds 10 seconds, the pattern collapse may occur due to the drying step.

By performing the drying step as described above, the dissolution product occurring during the development can be discharged once to the outside of the wafer W, so that the defect performance can be improved.

Note that there is an advantage obtained by not including the drying step in the developing treatment as in the first embodiment. The advantage is that the surface of the wafer W including the resist pattern is in a state of being pre-wetted with DIW in the developing treatment in the first embodiment, and is therefore excellent in coating property of the aqueous solution of the water-soluble polymer.

Whether to include the drying step as in this embodiment or not to include the drying step as in the first embodiment may be decided according to the viscosity of the aqueous solution of the water-soluble polymer.

Also in the developing treatment in this embodiment, a heating apparatus may be provided in the developing treatment apparatus as in the second embodiment to heat the wafer W after the coating with the aqueous solution of the water-soluble polymer and before the cleaning with the rinse solution.

Industrial Applicability

The present invention is useful in developing a substrate and cleaning it thereafter.

Explanation of Codes

1 . . . substrate treatment system
30 . . . developing treatment apparatus
130 . . . treatment container
140 . . . spin chuck
141 . . . chuck drive unit
150 . . . cup
165 . . . developing solution supply nozzle
168 . . . water-based cleaning solution supply nozzle
171 . . . aqueous solution supply nozzle
174 . . . rinse solution supply nozzle
180 . . . lamp heating apparatus
300 . . . control unit

What is claimed is:

1. A developing treatment method for performing a developing treatment on a resist film on a substrate, the developing treatment method comprising:
a pattern forming step of forming a resist pattern by supplying a developing solution to the substrate and developing the resist film on the substrate;
a coating step of coating the developed substrate with an aqueous solution of a water-soluble polymer having an OH group so that a solution film covering the resist pattern up to a top surface of the resist pattern is formed, and forming a polymer film having the OH group adhering to each surface of the resist pattern and a lower film exposed between patterns of the resist pattern, wherein the polymer film is generated by a cross-linking reaction between the water-soluble polymer and the each surface; and
a rinse step of cleaning the substrate by supplying a rinse solution to the substrate coated with the aqueous solution of the water-soluble polymer.

2. The developing treatment method according to claim 1, further comprising
a cleaning step of cleaning the substrate by supplying a water-based cleaning solution to the developed substrate after the pattern forming step and before the coating step.

3. The developing treatment method according to claim 2, further comprising
a drying step of drying the substrate after the cleaning step and before the coating step.

4. The developing treatment method according to claim 3, wherein the drying step comprises rotating the substrate for less than 10 seconds.

5. The developing treatment method according to claim 2, further comprising
after the cleaning step and before the coating step, changing, based on a viscosity of the aqueous solution of the water-soluble polymer to be provided in the coating step, the surface of the developed substrate supplied with the water-based cleaning solution to be more hydrophilic.

6. The developing treatment method according to claim 1, wherein the water-soluble polymer is a homopolymer or a copolymer of a monomer containing the OH group, or a polycondensate having the OH group.

7. The developing treatment method according to claim 6, wherein the aqueous solution of the water-soluble polymer has an added surfactant.

8. The developing treatment method according to claim 1, wherein a pH of the aqueous solution of the water-soluble polymer is 3 to 6.

9. The developing treatment method according to claim 1, wherein the rinse solution contains a surfactant.

10. The developing treatment method according to claim 1, further comprising
heating the substrate after the coating step and before the rinse step.

11. A developing treatment method for performing a developing treatment on a resist film on a substrate, the developing treatment method comprising:
a pattern forming step of forming a resist pattern by supplying a developing solution to the substrate and developing the resist film on the substrate;
a coating step of coating the developed substrate with an aqueous solution of a water-soluble polymer; and
a rinse step of supplying a rinse solution made by mixing a surfactant solution and pure water to the substrate coated with the aqueous solution of the water-soluble polymer so that the aqueous solution of the water-soluble polymer which is present in liquid state on the developed substrate is replaced with the rinse solution, and spinning off the rinse solution to dry the substrate by increasing a rotation speed of the substrate.

12. The developing treatment method according to claim 11, further comprising a cleaning step of cleaning the substrate by supplying a water-based cleaning solution to the developed substrate after the pattern forming step and before the coating step.

13. The developing treatment method according to claim 12, further comprising a drying step of drying the substrate after the cleaning step and before the coating step.

14. The developing treatment method according to claim 13, wherein the drying step comprises rotating the substrate for less than 10 seconds.

15. The developing treatment method according to claim 11, wherein the water-soluble polymer is a homopolymer or a copolymer of a monomer containing a hydrophilic group, or a polycondensate having a hydrophilic group.

16. The developing treatment method according to claim 15, wherein the aqueous solution of the water-soluble polymer has an added surfactant.

17. The developing treatment method according to claim 11, wherein a pH of the aqueous solution of the water-soluble polymer is 3 to 6.

18. The developing treatment method according to claim 11, further comprising heating the substrate after the coating step and before the rinse step.

* * * * *